(12) United States Patent
Yoshinari et al.

(10) Patent No.: US 11,626,807 B2
(45) Date of Patent: Apr. 11, 2023

(54) DC POWER SUPPLY DEVICE

(71) Applicant: Koki Holdings Co., Ltd., Tokyo (JP)

(72) Inventors: Takuya Yoshinari, Ibaraki (JP); Yuji Kishima, Ibaraki (JP); Eiji Nakayama, Ibaraki (JP); Kazuhiko Funabashi, Ibaraki (JP); Haruhisa Fujisawa, Ibaraki (JP)

(73) Assignee: Koki Holdings Co., Ltd., Tokyo (JP)

( * ) Notice: Subject to any disclaimer, the term of this patent is extended or adjusted under 35 U.S.C. 154(b) by 261 days.

(21) Appl. No.: 17/263,162

(22) PCT Filed: Jun. 28, 2019

(86) PCT No.: PCT/JP2019/025898
§ 371 (c)(1),
(2) Date: Jan. 26, 2021

(87) PCT Pub. No.: WO2020/026665
PCT Pub. Date: Feb. 6, 2020

(65) Prior Publication Data
US 2022/0216799 A1 Jul. 7, 2022

(30) Foreign Application Priority Data

Jul. 31, 2018 (JP) .............................. JP2018-143667

(51) Int. Cl.
*H02M 5/458* (2006.01)
*H02M 7/00* (2006.01)
(Continued)

(52) U.S. Cl.
CPC ........... *H02M 5/458* (2013.01); *H02J 7/0063* (2013.01); *H02J 7/0068* (2013.01); *H02M 7/003* (2013.01); *H05K 7/20909* (2013.01)

(58) Field of Classification Search
CPC .. H05K 7/20909; H02M 7/003; H02M 5/458; H02J 7/0068; H02J 7/0063
(Continued)

(56) References Cited

U.S. PATENT DOCUMENTS

2004/0232892 A1* 11/2004 Aradachi .............. H02J 7/0068
320/150
2009/0108828 A1* 4/2009 Edamula ................... H02J 1/06
323/318
(Continued)

FOREIGN PATENT DOCUMENTS

JP 2005278375 10/2005
JP 2005295672 10/2005
(Continued)

OTHER PUBLICATIONS

"International Search Report (Form PCT/ISA/210) of PCT/JP2019/025898", dated Sep. 10, 2019, with English translation thereof, pp. 1-3.

*Primary Examiner* — Michael R. Fin
(74) *Attorney, Agent, or Firm* — JCIPRNET

(57) ABSTRACT

A DC power supply device includes a first conversion unit connected to an AC power supply, a second conversion unit connected to an electric tool, and a cable connecting the first conversion unit and the second conversion unit to each other. The first conversion unit includes a power factor correction circuit, converts an AC voltage having a first voltage value, input from the AC power supply, into a DC voltage having a second voltage value higher than the first voltage value, and outputs the DC voltage having the second voltage value to the cable. The second conversion unit converts the output voltage of the first conversion unit, input via the cable, into a DC voltage having a third voltage value lower than the
(Continued)

second voltage value, and outputs the DC voltage having the third voltage value to the electric tool.

17 Claims, 6 Drawing Sheets

(51) Int. Cl.
*H02J 7/00* (2006.01)
*H05K 7/20* (2006.01)

(58) Field of Classification Search
USPC .................................................. 307/20, 150
See application file for complete search history.

(56) References Cited

U.S. PATENT DOCUMENTS

| | | | | |
|---|---|---|---|---|
| 2015/0143150 | A1* | 5/2015 | Verdun | G06F 1/26 713/323 |
| 2016/0250743 | A1* | 9/2016 | Kikuchi | B25F 5/02 173/46 |
| 2018/0004186 | A1* | 1/2018 | Tanaka | B23Q 5/58 |
| 2020/0227931 | A1* | 7/2020 | Yamaguchi | H01M 10/486 |
| 2020/0295659 | A1* | 9/2020 | Yoshinari | H02M 7/003 |

FOREIGN PATENT DOCUMENTS

| | | |
|---|---|---|
| JP | 2014017953 | 1/2014 |
| JP | 2017162274 | 9/2017 |

\* cited by examiner

10 First conversion unit

30 Second conversion unit

DC POWER SUPPLY DEVICE

CROSS-REFERENCE TO RELATED APPLICATION

This application is a 371 application of the International PCT application serial no. PCT/JP2019/025898, filed on Jun. 28, 2019, which claims the priority benefit of Japan Patent Application No. 2018-143667, filed on Jul. 31, 2018. The entirety of each of the above-mentioned patent applications is hereby incorporated by reference herein and made a part of this specification.

TECHNICAL FIELD

The present invention relates to a DC power supply device converting an AC voltage input from an AC power supply into a DC voltage and supplying the DC voltage to an electric tool.

RELATED ART

A DC power supply device as shown in Patent Document 1 below includes a converter unit converting an AC voltage of 100 V input from a commercial power supply or the like into a DC voltage of a desired voltage value lower than 100 V and outputting the DC voltage, an adapter connectable to a battery pack connection part of a cordless electric tool, and a cable connecting the converter unit and the adapter to each other. For the convenience of being connected to the battery pack connection part of the electric tool, it is necessary for the adapter to be small-size and lightweight, and to have substantially the same shape as a battery pack that can be connected, in place of the adapter, to the battery pack connection part of the electric tool. Hence, circuit elements such as a rectifier circuit, a smoothing circuit and a transformer are provided in a converter unit provided separately from the adapter.

PRIOR-ART DOCUMENTS

Patent Documents

Patent Document 1: Japanese Patent Laid-open No. 2005-278375

SUMMARY OF THE INVENTION

Problems to Be Solved by the Invention

When alternating current is converted into direct current in the converter unit and output at a desired low voltage value, a large amount of current flows in a cable from the converter unit to the adapter, and there is a large power loss at the cable. In a DC power supply device supplying DC power to an electric tool that requires large power, the power loss in the case where a low voltage is output from the converter unit is particularly large.

An object of the present invention is to provide a DC power supply device capable of suppressing power loss.

Means for Solving the Problems

One aspect of the present invention is a DC power supply device. The DC power supply device includes: a first conversion unit connected to an external AC power supply; a second conversion unit connected to an external electric tool; and a cable connecting the first and second conversion units to each other. The first conversion unit includes a power factor correction circuit, converts an AC voltage of a first voltage value input from the external AC power supply into a DC voltage of a second voltage value higher than the first voltage value, and outputs the DC voltage of the second voltage value to the cable. The second conversion unit converts an output voltage of the first conversion unit that is input via the cable into a DC voltage of a third voltage value lower than the second voltage value, and outputs the DC voltage of the third voltage value to the external electric tool.

The second conversion unit may be connectable to a battery pack connection part of the external electric tool driven by power of a battery pack detachably connected thereto, in place of the battery pack.

The second conversion unit may include an energization signal generator generating an energization signal indicating that a DC voltage is being input to the second conversion unit via the cable. The cable may include an energization signal transmission line transmitting the energization signal from the second conversion unit to the first conversion unit. The first conversion unit may include a cutoff circuit that, when the energization signal from the energization signal transmission line disappears while the DC voltage is being output to the cable, cuts off the output of the DC voltage to the cable.

The first conversion unit may include a first control part connected to the energization signal transmission line and controlling the cutoff circuit.

The first control part may set the cutoff circuit to a cutoff state when an abnormality is detected.

The second conversion unit may include a second control part, and the second control part may transmit an abnormality detection signal to the external electric tool connected thereto when the abnormality is detected.

The first conversion unit may include a reset terminal restoring the first control part to an initial state, and the first control part may set the cutoff circuit to a non-cutoff state when restored to the initial state.

The cutoff circuit may include a switching element provided in a path of an alternating current of the first conversion unit.

The first conversion unit may include a first cooling fan generating cooling air inside the first conversion unit. The second conversion unit may include a second cooling fan generating cooling air inside the second conversion unit.

The first conversion unit may include a first control part controlling driving of the first cooling fan. The second conversion unit may include a second control part controlling driving of the second cooling fan.

The second conversion unit may lower its output voltage as its output current increases.

The first conversion unit may include: a first input part connected to the external AC power supply, to which the AC voltage of the first voltage value is input; the power factor correction circuit connected to the first input part; a rectifier circuit connected to an output side of the power factor correction circuit; a boosting circuit boosting an output voltage of the rectifier circuit; a smoothing circuit smoothing an output voltage of the boosting circuit; and a first output part connected to the cable and outputting the DC voltage of the second voltage value output from the smoothing circuit to the cable.

The second conversion unit may include: a second input part connected to the cable, to which the DC voltage of the second voltage value is input; a transformer circuit transforming the DC voltage input to the second input part and outputting the DC voltage of the third voltage value lower than the second voltage value; and a second output part connected to the external electric tool and outputting an output voltage of the transformer circuit to the external electric tool.

The transformer circuit may include an isolation transformer, and a switching element connected to a primary side of the isolation transformer.

The first voltage value may be 80 V or more and less than 260 V, the second voltage value may be 200 V or more and less than 500 V, and the third voltage value may be 0 V or more and less than 70 V.

Moreover, any combination of the above components and those obtained by converting the expression of the present invention into methods or systems and so on are also effective as aspects of the present invention.

Effects of the Invention

According to the present invention, a DC power supply device capable of suppressing power loss can be provided.

DESCRIPTION OF THE EMBODIMENTS

Figure 1:
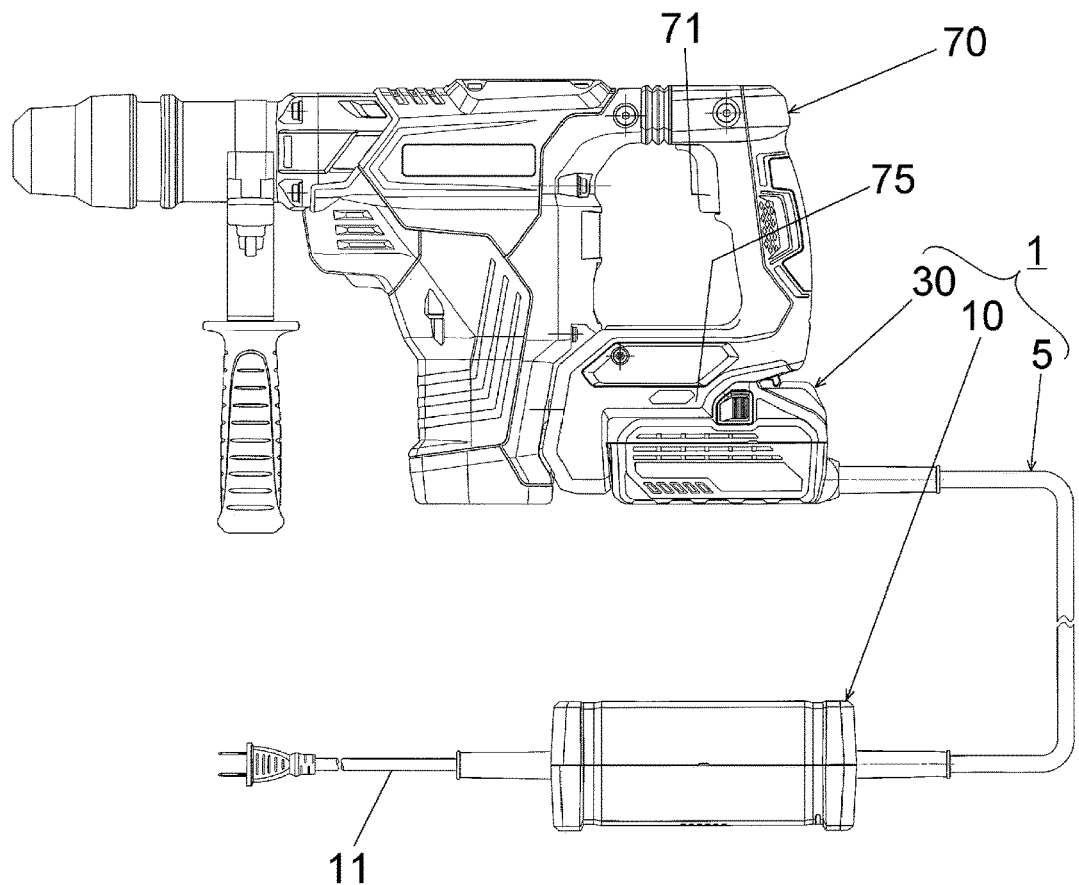
FIG. 1 is a side view of an electric tool 70 to which a DC power supply device 1 and a second conversion unit 30 thereof according to Embodiment 1 of the present invention are connected.

Hereinafter, preferred embodiments of the present invention are described in detail with reference to the drawings. Moreover, the same or equivalent components, members and so on shown in the drawings are denoted by the same reference numerals, and repeated descriptions are properly omitted. In addition, the embodiments do not limit the invention but are intended to be exemplary, and all of the features and combinations thereof described in the embodiments are not necessarily essential to the invention.

Figure 2:
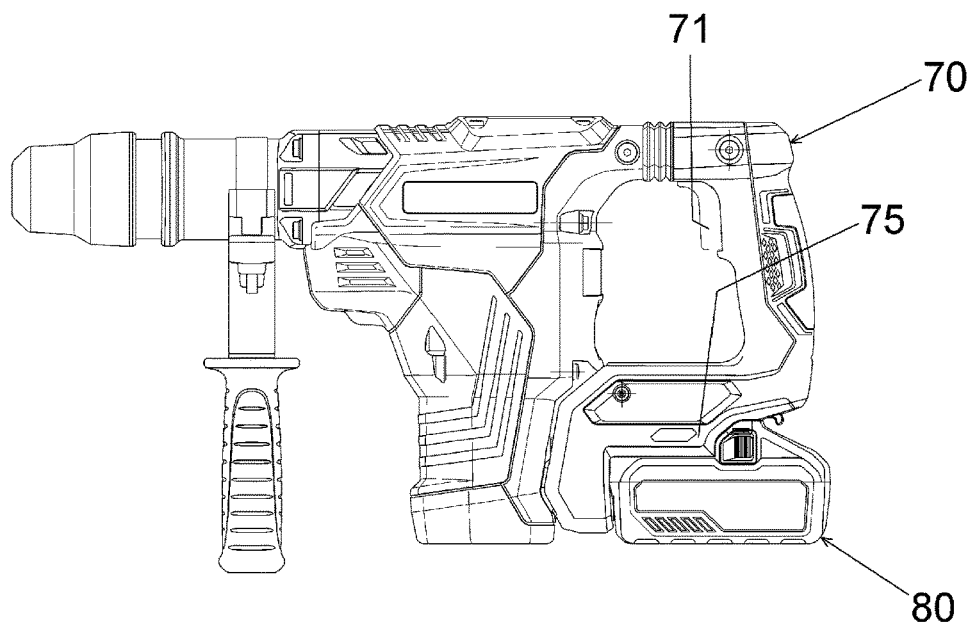
FIG. 2 is a side view of the electric tool 70 equipped with a battery pack 80.

(Embodiment 1) With reference to FIG. 1 to FIG. 7, a DC power supply device 1 according to Embodiment 1 of the present invention is described. A front-rear direction of the DC power supply device 1 is defined by FIG. 3. The DC power supply device 1 includes a first conversion unit 10, a second conversion unit 30, and a cable 5. The first conversion unit 10 is connected to an external AC power supply by a power supply cord 11. The second conversion unit 30 is detachably connected to a battery pack connection part 75 of an electric tool 70. A battery pack 80 can also be detachably connected to the battery pack connection part 75 of the electric tool 70, as shown in FIG. 2. By a worker turning on a trigger switch 71 of the electric tool 70, driving power is supplied from the DC power supply device 1 or the battery pack 80 to the electric tool 70. Although the electric tool 70 is a hammer drill in the illustrated example, its type is not limited as long as it is an electric tool to which the battery pack 80 is detachably connected. The cable 5 connects the first conversion unit 10 and the second conversion unit 30 to each other. The cable 5 is desirably longer than the power supply cord 11. By making the cable 5 sufficiently long, during work with the electric tool 70, there is neither a need to float the first conversion unit 10 from the floor or the like, nor a need for the worker to support the weight of the first conversion unit 10, and workability is improved.

Figure 3:
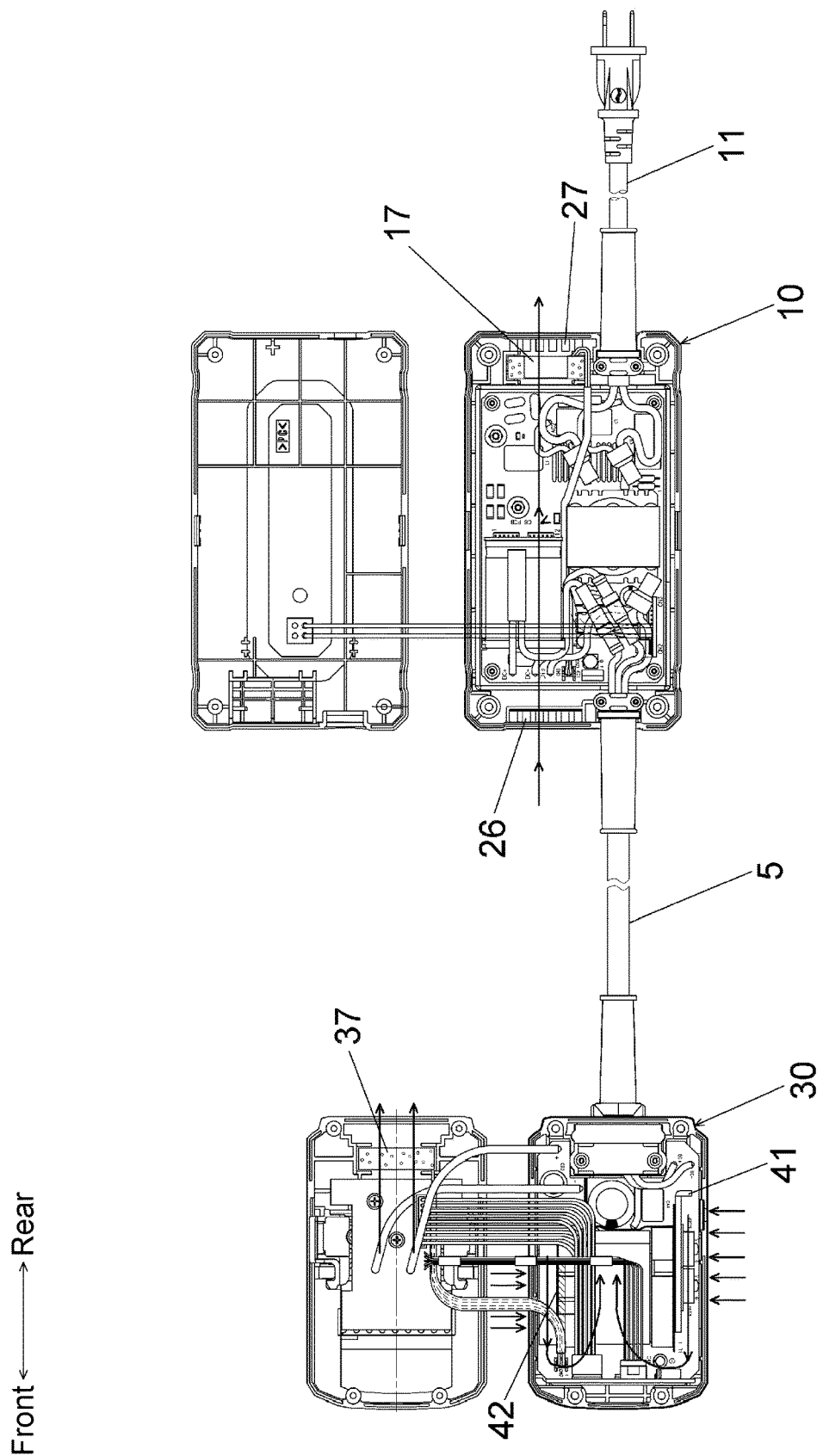
FIG. 3 is a plan view of the DC power supply device 1 in which a first conversion unit 10 and the second conversion unit 30 have their respective upper cases unfolded.

As shown in FIG. 3, a first cooling fan 17 is provided at a rear end of and inside the first conversion unit 10. A second cooling fan 37 is provided at a rear end of and inside the second conversion unit 30. The flow of cooling air generated by the first cooling fan 17 and the second cooling fan 37 is shown by arrows in FIG. 3. The cooling air generated by the first cooling fan 17 is sucked in from an intake port 26 provided at a front part of a housing of the first conversion unit 10, flows forward while cooling each component of the first conversion unit 10, and is discharged from an exhaust port 27 provided at a rear part of the housing. The cooling air generated by the second cooling fan 37 is sucked in from intake ports on both side surfaces of a housing of the second conversion unit 30, cools each component on both side parts of and inside the second conversion unit 30 while being guided forward by fins 41 and 42, flows from the front to the rear in a central part of the housing while cooling each component of a central part of the second conversion unit 30 in a width direction, and is discharged from an exhaust port provided at a rear part of the housing.

Figure 4:
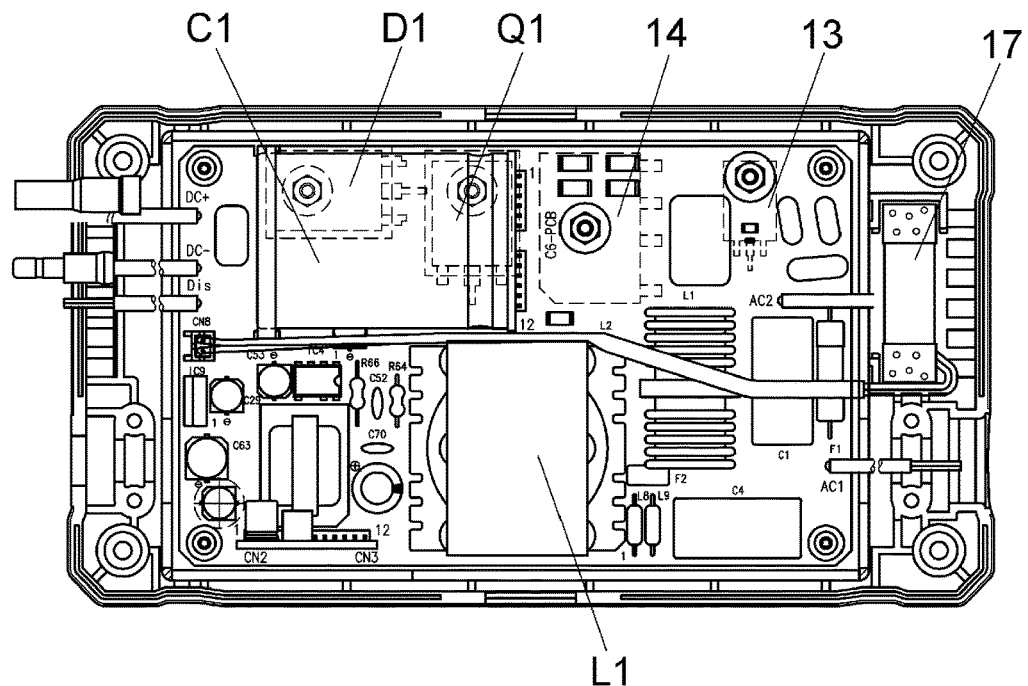
FIG. 4 is a plan view showing an internal configuration of the first conversion unit 10.
Figure 5:
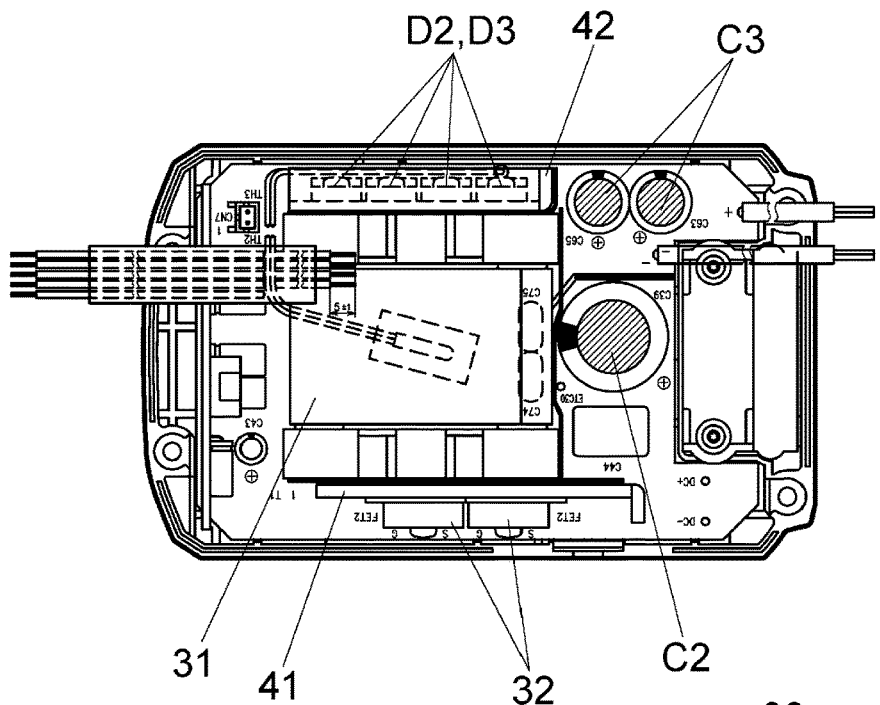
FIG. 5 is a plan view showing an internal configuration of the second conversion unit 30.

As shown in FIG. 4, in the first conversion unit 10, the components such as an electrolytic capacitor C1, a diode D1, a switching element Q1, a diode bridge 14, a TRIAC 13 as a switching element, and an inductor L1 are provided. As shown in FIG. 5, in the second conversion unit 30, the components such as diodes D2 and D3, the fins 41 and 42, electrolytic capacitors C2 and C3, an isolation transformer 31, and a switching element 32 are provided.

Figure 6:
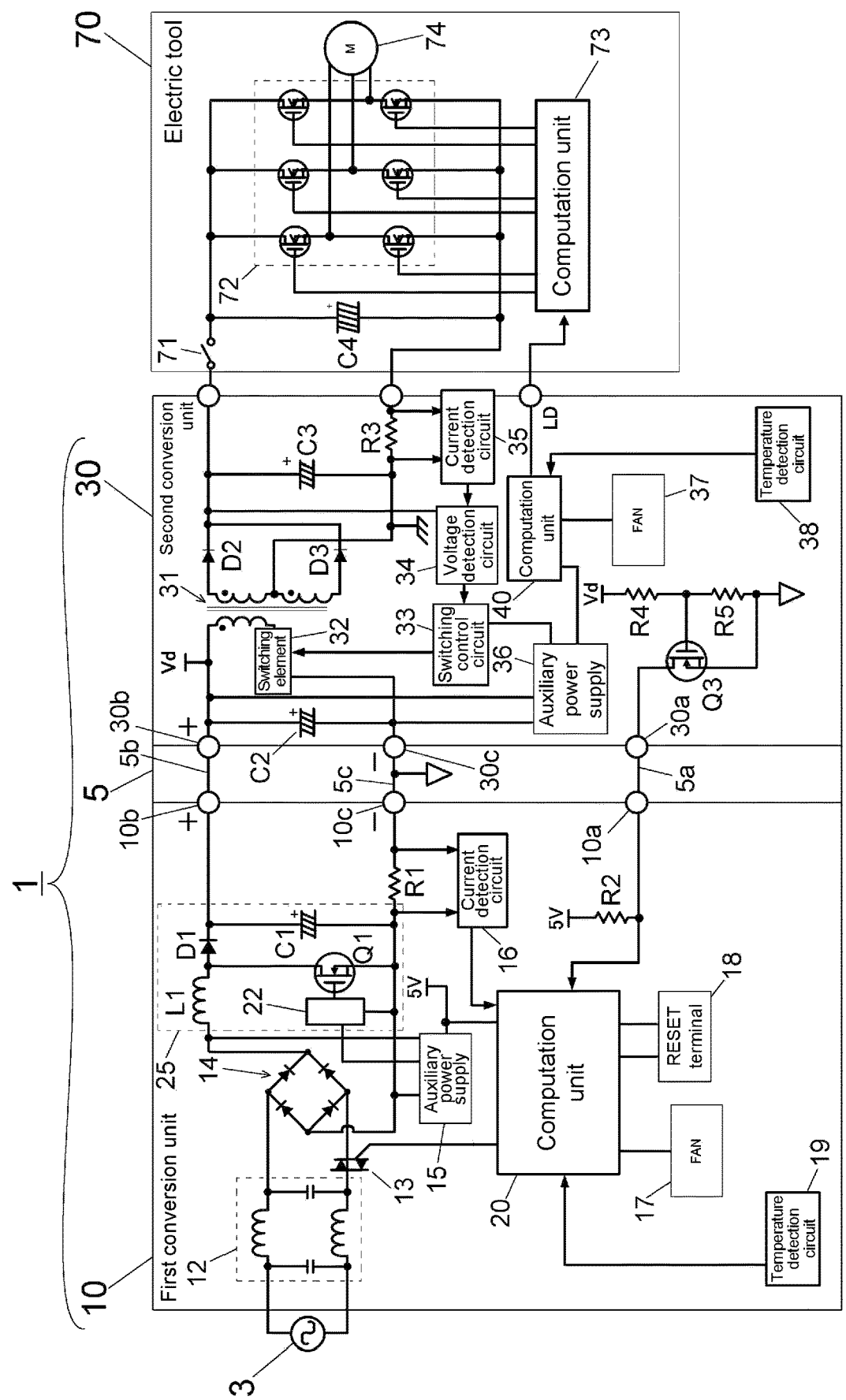
FIG. 6 is a circuit block view of the DC power supply device 1 and the electric tool 70.

FIG. 6 is a circuit block view of the DC power supply device 1 and the electric tool 70. In the first conversion unit 10, two terminals connected to an external AC power supply 3 define a first input part. Among connection terminals to the cable 5, two terminals (a plus (+) terminal 10b and a minus (−) terminal 10c) connected to an output terminal of a boosting and smoothing circuit 25 define a first output part. The first conversion unit 10 includes a power factor correction circuit 12, the TRIAC 13 as a cutoff circuit, the diode bridge 14 as a rectifier circuit, and the boosting and smoothing circuit 25. An input terminal of the power factor correction circuit 12 is connected to the AC power supply 3. A peak value (first voltage value) of an AC voltage input from the AC power supply 3 is, for example, 80 V or more and less than 260 V.

An input terminal of the diode bridge 14 is connected to an output terminal of the power factor correction circuit 12. The TRIAC 13 is provided in a current path between the power factor correction circuit 12 and the diode bridge 14. The TRIAC 13 is provided to switch the output/cutoff of the first conversion unit 10. The diode bridge 14 rectifies an output current of the power factor correction circuit 12. The boosting and smoothing circuit 25 boosts an output voltage of the diode bridge 14. In the boosting and smoothing circuit 25, the inductor L1, the diode D1, the switching element Q1 and the driver circuit 22 constitute a boosting circuit. The electrolytic capacitor C1 constitutes a smoothing circuit that smooths an output voltage of the boosting circuit. A voltage value (second voltage value) of a DC voltage output from the boosting and smoothing circuit 25, that is, a voltage value of an output voltage of the first conversion unit 10 is, for example, 200 V or more and less than 500 V. The second voltage value is higher than the first voltage value.

In the first conversion unit 10, a detection resistor R1 is provided in a path of an output current of the boosting and smoothing circuit 25 (an output current of the first conversion unit 10). An auxiliary power supply 15 converts the output voltage of the diode bridge 14 into an operating voltage (for example, DC 5V) of a computation unit 20 or the like. A current detection circuit 16 detects the output current of the boosting and smoothing circuit 25 based on a voltage across the detection resistor R1 and feeds it back to the computation unit 20. A temperature detection circuit 19 includes a temperature detection element such as a thermistor, detects a temperature in the first conversion unit 10, and feeds it back to the computation unit 20. The computation unit 20 is an example of a first control part and includes a microcontroller. The computation unit 20 drives the first cooling fan 17 according to a temperature detection value from the temperature detection circuit 19. In addition, when an abnormal temperature is detected by the temperature detection circuit 19, when an abnormal current is detected by the current detection circuit 16, or when a disconnection of the cable 5 is detected, the computation unit 20 turns off the TRIAC 13 and cuts off the output of the first conversion unit 10. One end of a resistor R2 is connected to a power supply line to which an output voltage of the auxiliary power supply 15 is supplied. The other end of the resistor R2 is connected to the computation unit 20 and also connected to an energization signal transmission line 5a of the cable 5 via an abnormality detection terminal 10a. That is, the computation unit 20 is connected to the energization signal transmission line 5a of the cable 5 via the abnormality detection terminal 10a. In the case where replacement of the cable 5 is completed after the computation unit 20 turns off the TRIAC 13 when the cable 5 is broken, a reset terminal 18 is provided in order to restore the computation unit 20 to an initial state. By performing a reset operation on the reset terminal 18, the computation unit 20 is restored to the initial state and turns on the TRIAC 13 again (sets it to a non-cutoff state).

In the second conversion unit 30, among the connection terminals to the cable 5, two terminals (a plus (+) terminal 30b and a minus (−) terminal 30c) connected to an input side of the isolation transformer 31 define a second input part. Among connection terminals to the electric tool 70, two terminals connected to both ends of the electrolytic capacitor C3 define a second output part. The electrolytic capacitor C2 is provided between the two terminals that constitute the second input part. The isolation transformer 31, the switching element 32, the diodes D2 and D3, and the electrolytic capacitor C3 constitute a transformer circuit. The switching element 32 is provided on a primary side of the isolation transformer 31. The diodes D2 and D3 are provided on a secondary side of the isolation transformer 31. A voltage on the secondary side of the isolation transformer 31 is smoothed by the electrolytic capacitor C3. A voltage value (third voltage value) of a DC voltage on the secondary side of the isolation transformer 31 is, for example, 0 V or more and less than 400 V, and is particularly desirably set in a range of 0 V or more and less than 70 V to match a rated voltage of the electric tool 70 to be connected. The third voltage value is lower than the second voltage value. A detection resistor R3 is provided in a path of an output current of the isolation transformer 31 and the electrolytic capacitor C3 (an output current of the second conversion unit 30). A current detection circuit 35 detects the output current of the isolation transformer 31 and the electrolytic capacitor C3 based on a voltage across the detection resistor R3. A voltage detection circuit 34 detects a voltage across the isolation transformer 31. A switching control circuit 33 controls on/off of the switching element 32 according to a current detection value from the current detection circuit 35 and a voltage detection value from the voltage detection circuit 34.

An auxiliary power supply 36 converts an input voltage from the cable 5 into an operating voltage of the switching control circuit 33 and a computation unit 40 or the like. A temperature detection circuit 38 includes a temperature detection element such as a thermistor, detects a temperature in the second conversion unit 30, and feeds it back to the computation unit 40. The computation unit 40 is an example of a second control part and includes a microcontroller. The computation unit 40 drives the second cooling fan 37 according to a temperature detection value from the temperature detection circuit 38. In addition, when an abnormal temperature is detected by the temperature detection circuit 38, the computation unit 40 transmits an off signal (abnormality detection signal) to a computation unit 73 of the electric tool 70 via an LD terminal and stops the driving of the electric tool 70. Resistors R4 and R5 are connected in series between a power supply line to which an output voltage of the auxiliary power supply 36 is supplied and the ground. A gate of a switching element Q3 is connected to an interconnection terminal of the resistors R4 and R5. A source of the switching element Q3 is connected to the ground. A drain of the switching element Q3 is connected to the energization signal transmission line 5a of the cable 5 via an abnormality detection terminal 30a. The resistors R4 and R5 and the switching element Q3 constitute an energization signal generator.

When the cable 5 is not broken, a voltage between the gate and source of the switching element Q3 is positive, and the switching element Q3 is on. Hence, the abnormality detection terminals 30a and 10a have a ground potential. In the case where the abnormality detection terminal 10a has the ground potential (where there is an energization signal from the energization signal transmission line 5a), the computation unit 20 determines that the cable 5 has not been broken. When the cable 5 is broken, a voltage of the abnormality detection terminal 10a is pulled up to 5 V by the resistor R2. In the case where the voltage of the abnormality detection terminal 10a becomes 5 V when a DC voltage is being output from the first conversion unit 10 to the cable 5 (where the energization signal from the energization signal transmission line 5a disappears), the computation unit 20 determines that the cable 5 has been broken, turns off the TRIAC 13, and cuts off the output of the first conversion unit 10. Moreover, the cable 5 has a three-wire structure including, in addition to the energization signal transmission line 5a, a plus (+) side power supply line 5b that connects the plus (+) terminal 10b provided on an output side of the first conversion unit 10 and the plus (+) terminal 30b provided on an input side of the second conversion unit 30, and a minus (−) side power supply line 5c that connects the minus (−) terminal 10c provided on the output side of the first conversion unit 10 and the minus (−) terminal 30c provided on the input side of the second conversion unit 30, and in some cases, at least one of the plus (+) side power supply line 5b and the minus (−) side power supply line 5c is broken, and the energization signal transmission line 5a is not broken. In this case, since the output voltage of the auxiliary power supply 36 disappears, the voltage between the gate and source of the switching element Q3 becomes 0, the switching element Q3 is turned off, and thus, the voltage of the abnormality detection terminal 10a is pulled up to 5 V by the resistor R2.

The electric tool 70 includes the trigger switch 71, an inverter circuit 72, the computation unit 73 as a control part, a motor 74, and an electrolytic capacitor C4. The electrolytic capacitor C4 is provided between input terminals of the inverter circuit 72. The inverter circuit 72 includes a switching element such as a three-phase bridge-connected FET or IGBT. The computation unit 73 controls driving of the motor 74 by controlling the inverter circuit 72. When receiving the off signal (abnormality detection signal) from the computation unit 40 of the second conversion unit 30 via the LD terminal, the computation unit 73 turns off the inverter circuit 72 regardless of the state of the trigger switch 71, and stops the driving of the motor 74.

Figure 7:
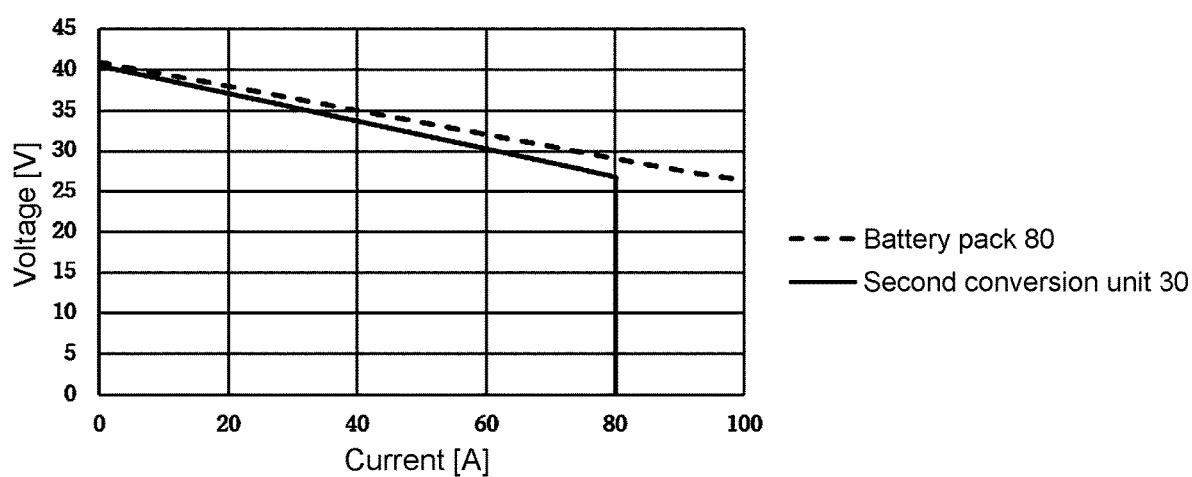
FIG. 7 is a graph showing one example of a relationship between output current and output voltage of the second conversion unit 30 and a relationship between output current and output voltage of the battery pack 80.

FIG. 7 is a graph showing one example of a relationship between output current and output voltage of the second conversion unit 30 and a relationship between output current and output voltage of the battery pack 80. The broken line shows a current-voltage characteristic of output of the battery pack 80. The solid line shows a current-voltage characteristic of output of the second conversion unit 30. The battery pack 80 has a characteristic that the output voltage falls as a load current increases. Correspondingly, the second conversion unit 30 also controls the output voltage by using the switching control circuit 33 so that the second conversion unit 30 has a similar characteristic to the current-voltage characteristic of output of the battery pack 80. That is, according to the current detection value (load current value) from the current detection circuit 35 and the voltage detection value from the voltage detection circuit 34, the switching control circuit 33 controls the switching element 32 so that the relationship between the voltage value and the current value becomes as shown by the solid line in FIG. 7. Moreover, to suppress an excessive supply of power to the electric tool 70, when the load current reaches 80 A, i.e., one example of the maximum output current of the second conversion unit 30, constant current control is performed so that no more current is supplied.

According to the present embodiment, the following effects can be achieved.

(1) In the first conversion unit 10, since an AC input voltage is converted into a DC voltage higher than a peak value of the AC input voltage and is output to the cable 5, the current flowing through the cable 5 can be reduced and power loss at the cable 5 can be suppressed as compared with the case where the AC input voltage is converted into a DC voltage of a low voltage value and output to the cable 5.

(2) Since the first conversion unit 10 is configured to turn off the TRIAC 13 and cut off the output of a DC voltage to the cable 5 when the cable 5 is broken, in the case where the cable 5 is accidentally cut off by a circular saw or the like, it can be suppressed that a high DC voltage appears in the broken portion of the cable 5.

(3) By providing in the first conversion unit 10 a large-size and heavyweight circuit component such as the power factor correction circuit 12, the second conversion unit 30 connected to the electric tool 70 can be made small-size and lightweight, and the operability of the electric tool 70 is good.

(4) Since the output current-output voltage characteristic of the second conversion unit 30 is made similar to the output current-output voltage characteristic of the battery pack 80, the usability of the electric tool 70 in the case of being supplied with power from the DC power supply device 1 can be close to the usability of the electric tool 70 in the case of being supplied with power from the battery pack 80.

(5) The first conversion unit 10 has a protection function in which the computation unit 20 turns off the TRIAC 13 and stops the output when an abnormality such as high temperature or overcurrent occurs. In addition, the second conversion unit 30 has a protection function in which, when an abnormality such as high temperature occurs, the computation unit 40 transmits an off signal to the electric tool 70 via the LD terminal, and the computation unit 73 in the electric tool 70 that has received the off signal stops the driving of the electric tool 70. In this way, both the first conversion unit 10 and the second conversion unit 30 have a protection function. By performing the double protection as a whole, even in the case where, for example, a significant temperature rise occurs in only one of the first conversion unit 10 and the second conversion unit 30, the power supply to the electric tool 70 or the driving of the electric tool 70 can be stopped, and a malfunction of the DC power supply device 1 can be suppressed.

Figure 8:
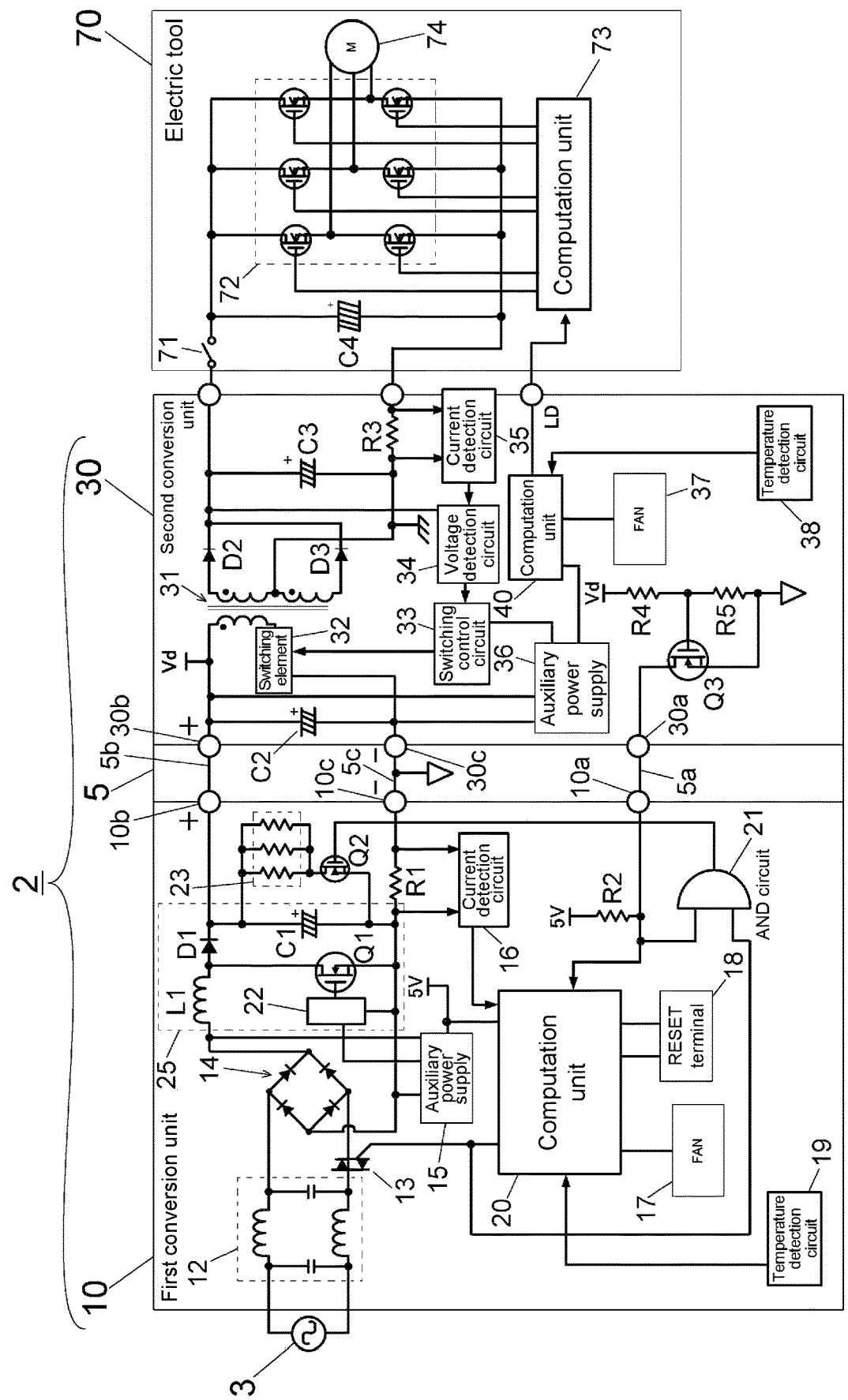
FIG. 8 is a circuit block view of a DC power supply device 2 and the electric tool 70 according to Embodiment 2 of the present invention.

(Embodiment 2) FIG. 8 is a circuit block view of a DC power supply device 2 and the electric tool 70 according to Embodiment 2 of the present invention. Compared with that of Embodiment 1 shown in FIG. 6, the DC power supply device 2 is different in that a discharge resistor 23, a switching element Q2, and an AND circuit 21 are added, and is the same in other respects. The discharge resistor 23 and the switching element Q2 are connected in series between both terminals of the electrolytic capacitor C1 so as to be in parallel with the electrolytic capacitor C1. A gate of the switching element Q2 is connected to an output terminal of the AND circuit 21. One input terminal of the AND circuit 21 is connected to the other end of the resistor R2 and the computation unit 20. The other input terminal of the AND circuit 21 is connected to a control terminal of the TRIAC 13 and the computation unit 20.

When the cable 5 is not broken, if the output voltage of the first conversion unit 10 is normal (for example, 380 V), since the switching element Q3 of the second conversion unit 30 is turned on, an input signal (signal of the one input terminal of the AND circuit 21) from the abnormality detection terminal 10a to the computation unit 20 becomes 0 (low level). At this time, a gate signal (signal of the other input terminal of the AND circuit 21) from the computation unit 20 to the TRIAC 13 is also 0. Thus, the output of the AND circuit 21 becomes 0, and the switching element Q2 is off.

When the cable 5 is broken, since the switching element Q3 is off, the input signal (signal of the one input terminal of the AND circuit 21) from the abnormality detection terminal 10a to the computation unit 20 becomes 1 (high level), and the gate signal (signal of the other input terminal of the AND circuit 21) from the computation unit 20 that detects the disconnection to the TRIAC 13 is also 1. Thus, the output of the AND circuit 21 becomes 1, and the switching element Q2 is turned on. Accordingly, an electric charge of the electrolytic capacitor C1 is discharged via the discharge resistor 23 and the switching element Q2.

Although the present invention has been heretofore described referring to the embodiments as examples, it is to be understood by those skilled in the art that various modifications of the components and processing processes of the embodiments can be made within the scope described in the claims.

What is claimed is:

1. A DC power supply device, comprising:
a first conversion unit connected to an external AC power supply;
a second conversion unit connected to an external electric tool; and
a cable connecting the first conversion unit and the second conversion unit to each other, wherein
the first conversion unit comprises a power factor correction circuit, converts an AC voltage of a first voltage value input from the external AC power supply into a DC voltage of a second voltage value higher than the first voltage value, and outputs the DC voltage of the second voltage value to the cable;
the second conversion unit converts an output voltage of the first conversion unit that is input via the cable into a DC voltage of a third voltage value lower than the second voltage value, and outputs the DC voltage of the third voltage value to the external electric tool,
the first conversion unit comprises a cutoff circuit that, when the cable is broken, cuts off an output of the DC voltage to the cable.

2. The DC power supply device as claimed in claim 1, wherein the second conversion unit is connectable to a battery pack connection part of the external electric tool driven by power of a battery pack detachably connected thereto, in place of the battery pack.

3. The DC power supply device as claimed in claim 1, wherein
the second conversion unit comprises an energization signal generator generating an energization signal indicating that a DC voltage is being input to the second conversion unit via the cable;
the cable comprises an energization signal transmission line transmitting the energization signal from the second conversion unit to the first conversion unit;
the cutoff circuit cuts off the output of the DC voltage to the cable when the energization signal from the energization signal transmission line disappears while the DC voltage is being output to the cable.

4. The DC power supply device as claimed in claim 3, wherein the first conversion unit comprises a first control part connected to the energization signal transmission line and controlling the cutoff circuit.

5. The DC power supply device as claimed in claim 4, wherein the first control part sets the cutoff circuit to a cutoff state when an abnormality is detected.

6. The DC power supply device as claimed in claim 5, wherein
the second conversion unit comprises a second control part, and
the second control part transmits an abnormality detection signal to the external electric tool connected thereto when the abnormality is detected.

7. The DC power supply device as claimed in claim 4, wherein
the first conversion unit comprises a reset terminal restoring the first control part to an initial state, and
the first control part sets the cutoff circuit to a non-cutoff state when restored to the initial state.

8. The DC power supply device as claimed in claim 3, wherein the cutoff circuit comprises a switching element provided in a path of an alternating current of the first conversion unit.

9. The DC power supply device as claimed in claim 1, wherein
the first conversion unit comprises a first cooling fan generating cooling air inside the first conversion unit;
the second conversion unit comprises a second cooling fan generating cooling air inside the second conversion unit.

10. The DC power supply device as claimed in claim 9, wherein
the first conversion unit comprises a first control part controlling driving of the first cooling fan;
the second conversion unit comprises a second control part controlling driving of the second cooling fan.

11. The DC power supply device as claimed in claim 1, wherein the second conversion unit lowers an output voltage thereof as an output current thereof increases.

12. The DC power supply device as claimed in claim 1, wherein the first conversion unit comprises:
a first input part connected to the external AC power supply, to which the AC voltage of the first voltage value is input;
the power factor correction circuit connected to the first input part;
a rectifier circuit connected to an output side of the power factor correction circuit;
a boosting circuit boosting an output voltage of the rectifier circuit;
a smoothing circuit smoothing an output voltage of the boosting circuit; and
a first output part connected to the cable and outputting the DC voltage of the second voltage value output from the smoothing circuit to the cable.

13. The DC power supply device as claimed in claim 1, wherein the second conversion unit comprises:
a second input part connected to the cable, to which the DC voltage of the second voltage value is input;
a transformer circuit transforming the DC voltage input to the second input part and outputting the DC voltage of the third voltage value lower than the second voltage value; and
a second output part connected to the external electric tool and outputting an output voltage of the transformer circuit to the external electric tool.

14. The DC power supply device as claimed in claim 13, wherein the transformer circuit comprises an isolation transformer, and a switching element connected to a primary side of the isolation transformer.

15. The DC power supply device as claimed in claim 1, wherein the first voltage value is 80 V or more and less than 260 V, the second voltage value is 200 V or more and less than 500 V, and the third voltage value is 0 V or more and less than 70 V.

16. A DC power supply device, comprising:
a first conversion unit connected to an external AC power supply;
a second conversion unit connected to an external electric tool; and
a cable connecting the first conversion unit and the second conversion unit to each other, wherein
the first conversion unit comprises a power factor correction circuit, converts an AC voltage of a first voltage value input from the external AC power supply into a DC voltage of a second voltage value higher than the first voltage value, and outputs the DC voltage of the second voltage value to the cable;

the second conversion unit converts an output voltage of the first conversion unit that is input via the cable into a DC voltage of a third voltage value lower than the second voltage value, and outputs the DC voltage of the third voltage value to the external electric tool, the second conversion unit comprises an energization signal generator generating an energization signal indicating that a DC voltage is being input to the second conversion unit via the cable;

the cable comprises an energization signal transmission line transmitting the energization signal from the second conversion unit to the first conversion unit;

the first conversion unit comprises a cutoff circuit that, when the energization signal from the energization signal transmission line disappears while the DC voltage is being output to the cable, cuts off the output of the DC voltage to the cable.

17. A DC power supply device, comprising:
a first conversion unit connected to an external AC power supply;
a second conversion unit connected to an external electric tool; and
a cable connecting the first conversion unit and the second conversion unit to each other, wherein
the first conversion unit comprises a power factor correction circuit, converts an AC voltage of a first voltage value input from the external AC power supply into a DC voltage of a second voltage value higher than the first voltage value, and outputs the DC voltage of the second voltage value to the cable;
the second conversion unit converts an output voltage of the first conversion unit that is input via the cable into a DC voltage of a third voltage value lower than the second voltage value, and outputs the DC voltage of the third voltage value to the external electric tool,
the first conversion unit comprises a cutoff circuit that, when an abnormality is detected, cuts off an output of the DC voltage to the cable.

* * * * *